(12) United States Patent
Appelt et al.

(10) Patent No.: US 7,199,438 B2
(45) Date of Patent: Apr. 3, 2007

(54) OVERMOLDED OPTICAL PACKAGE

(75) Inventors: Bernd Karl Appelt, Sunnyvale, CA (US); William Tze-You Chen, Endicott, NY (US)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 10/667,605

(22) Filed: Sep. 23, 2003

(65) Prior Publication Data

US 2005/0073036 A1    Apr. 7, 2005

(51) Int. Cl.
H01L 31/0203 (2006.01)
H01L 23/02 (2006.01)
H01L 23/29 (2006.01)

(52) U.S. Cl. .................. 257/433; 257/434; 257/680; 257/790

(58) Field of Classification Search .......... 257/678, 257/680, 787, 788, 790, 791, 792, 793, 794, 257/432, 433–434; 438/106, 112, 116, 121, 438/124, 127
See application file for complete search history.

(56) References Cited

U.S. PATENT DOCUMENTS

| 4,732,042 | A  | * | 3/1988  | Adams ......................... 73/706 |
| 4,838,089 | A  | * | 6/1989  | Okada et al. ................ 257/680 |
| 5,544,529 | A  | * | 8/1996  | Mitani et al. ................. 73/716 |
| 5,897,338 | A  | * | 4/1999  | Kaldenberg ................. 438/116 |
| 6,191,359 | B1 | * | 2/2001  | Sengupta et al. .......... 174/52.3 |
| 6,266,197 | B1 | * | 7/2001  | Glenn et al. ................ 257/730 |
| 6,825,551 | B1 | * | 11/2004 | Do Bento Vieira ......... 257/678 |
| 2002/0070464 | A1 | * | 6/2002 | Frezza ......................... 257/788 |
| 2004/0017002 | A1 | * | 1/2004 | Siegel et al. ................ 257/684 |
| 2004/0041221 | A1 | * | 3/2004 | Boon et al. .................. 257/433 |

* cited by examiner

*Primary Examiner*—Ori Nadav

(57) ABSTRACT

An optical semiconductor package includes a substrate, a chip, a plurality of bonding wires, a window, a supporter, and an encapsulant. The chip is disposed on the substrate and has an optical element. The bonding wires are used for electrically connecting the chip to the substrate. The window is supported on the supporter and positioned over the optical element of the chip. The encapsulant is overmolded on the substrate for fixing the window and encapsulating the chip and the bonding wires.

7 Claims, 3 Drawing Sheets

OVERMOLDED OPTICAL PACKAGE

BACKGROUND OF THE INVENTION

1. Field of the Invention

The present invention relates to an optical semiconductor package, and more particularly, to an optical package which is manufactured by the overmolding process.

2. Description of the Related Art

Referring to FIG. 1, it depicts a typically optical package 10 in prior art. The optical package 10 comprises a carrier or a substrate 12 and a chip 20 mounded on the substrate 12. The substrate 12 has a sidewall 16 which surrounds the substrate 12. A transparent lid 32 is mounted on the sidewall 16 by an adhesive 34 so as to form a hermetic cavity 30 and transmit the light interacting with the chip 20. The chip 20 has optical elements 22, such as optical sensors or imaging sensors, and is disposed in the cavity 30. The chip 20 is electrically connected to a plurality of bonding pads 18 of the substrate 12 by a plurality of bonding wires 26. The bonding pads 18 on the upper surface of the substrate 12 are electrically connected to the solder pads 14 on the bottom surface thereof through traces or vias 19. Because of the requirements of the manufacturing process, the substrate 12 is typically made of ceramal, i.e., the substrate 12 is a kind of ceramic substrate. Furthermore, the bonding pads 18 and the solder pads 14 are disposed on the upper surface and the bottom surface of the substrate 12, respectively, so the substrate 12 is a multilayer structure.

However, the multilayer ceramic substrate 12 has long delivery lead times and is substantially expensive. The bonding wires 26 are connected to the bonding pads 18 and the chip 20 which are recessed in the cavity 30, so the cavity 30 or the space surrounded by the sidewall 16 has to be large enough that the wire bond tool (not shown) can gain access to the bonding pads 18 and the chip 20. Therefore, the cost of the substrate 12 is further increased. The ceramic substrate 12 is supplied typically as single units or small arrays and hence is assembled in single units or small arrays, rather than large matrix arrays, so the assembly cost of the package 10 is further increased.

Accordingly, there exists a need for an optical package which can use a planar substrate and be mass-produced to reduce the manufacturing cost of the optical package.

SUMMARY OF THE INVENTION

It is an object of the present invention to provide an optical package with a planar substrate for mass-producing and reducing the manufacturing cost.

In order to achieve the above object, the present invention provides an optical semiconductor package comprising a substrate, a chip, a plurality of bonding wires, a window, a supporter, and an encapsulant. The chip is disposed on the substrate and has an optical element. The bonding wires are used for electrically connecting the chip to the substrate. The window is supported on the supporter and positioned over the optical element of the chip. The encapsulant is overmolded on the substrate for fixing the window and encapsulating the chip and the bonding wires.

Accordingly, the substrate of the optical semiconductor package does not have to be provided with a cavity for receiving the chip, so the substrate can be substantially planar and be an organic laminate or ceramic substrate such that the cost of the substrate is substantially reduced. Furthermore, according to the manufacturing processes of the present invention, the substrate in matrix array can be utilized for mass production and the cost of the optical semiconductor package can be further reduced.

BRIEF DESCRIPTION OF THE DRAWINGS

Other objects, advantages, and novel features of the invention will become more apparent from the following detailed description when taken in conjunction with the accompanying drawing.

DESCRIPTION OF THE PREFERRED EMBODIMENT

Figure 1:
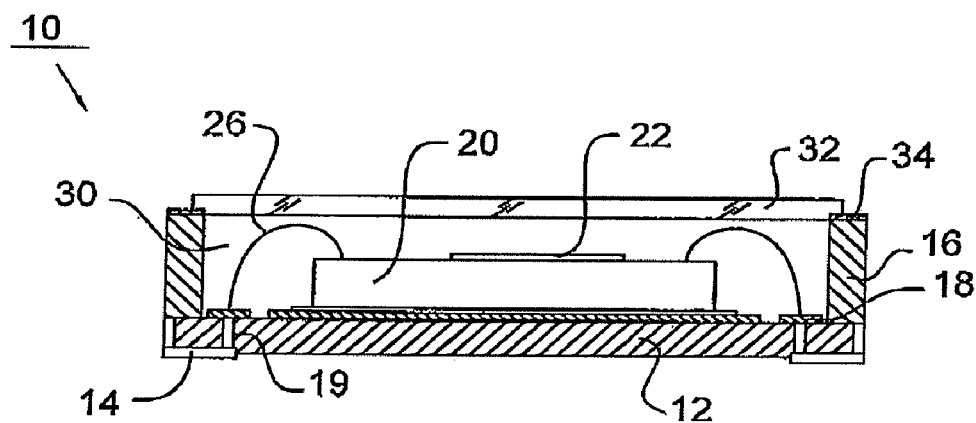
FIG. 1 is a schematic cross-sectional view of an optical package in the prior art.
Figure 2:
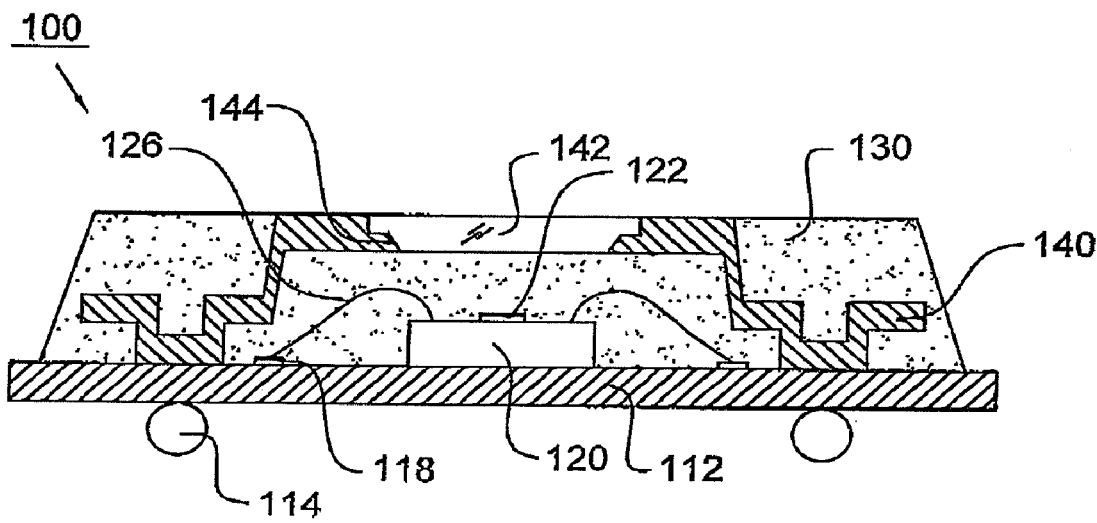
FIG. 2 is a schematic cross-sectional view of an optical package according to an embodiment of the present invention.

Referring to FIG. 2, it depicts an optical package 100 according to an embodiment of the present invention. The optical semiconductor package 100 comprises a carrier or substrate 112 which is substantially planar and a chip 120 mounted on the substrate 112. The substrate 112 can be either an organic laminate or a ceramic substrate. The chip 120 has optical elements 122, such as optical sensors or imaging sensors, and is electrically connected to a plurality of bonding pads 118 of the substrate 112 by a plurality of bonding wires 126. The substrate 112 is further provided with solder balls 114 electrically connected to the bonding pads 118 for being electrically connected to an external printing circuit board (not shown).

A supporter 140 is disposed on the substrate 112 and is provided with a shoulder 144 for supporting and holding a window 142. Then, an encapsulant 130 is formed by overmolding or insert molding process and the window 142 is kept in place. The window 142 is typically positioned above the optical elements 122 of the chip 120 for receiving or transmitting the light interacting with the optical elements 122. The encapsulant 130 is transparent plastic, such as acrylate, nylon, polycarbonate, and the like. The supporter 140 can be made of thermal conductive material for serving as a heat sink. Alternatively, the supporter 140 can be made of any plastic, such as PPS, Polycarbonate, LCP and the like, for reducing the cost.

The dimensions of the window 142 are designed such that the window 142 does not interfere with the bonding wires 126. The dimensions and shape of the supporter 140 depend on the height of the apexes of the bonding wires 126, the dimensions of the chip 120, and dimensions of the substrate 112. The space or gap between the window 142 and the optical elements 122 of the chip 120 is optimized for overmolding and for light transmission. That is, the gap needs to be large enough to allow the encapsulant 130 to be filled without disturbing the bonding wires 126 or the optical elements 122 and the gap needs to be small enough to permit sufficient transmission of light to ensure adequate operation of the optical sensor.

The material of the window 142 depends on the optical requirements. For example, the material of the window 142 can be glass for the light at the wavelength above 320 nm, or quartz for ultraviolet (UV) light. The window 142 also can be made of optically transparent plastic, such as acrylate, nylon, polycarbonate, and the like.

For high volume applications, the supporter 140 and the window 142 can be made integrally and made of plastic, such as acrylate, nylon, polycarbonate, and the like.

Figure 3:
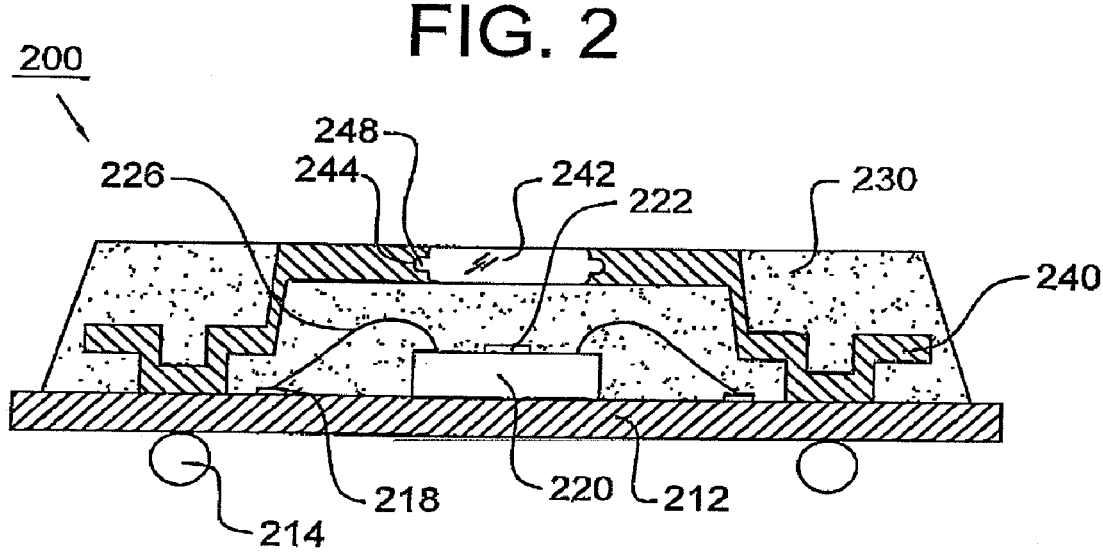
FIG. 3 is a schematic cross-sectional view of an optical package according to another embodiment of the present invention.

Now referring to FIG. 3, it depicts an optical semiconductor package 200 according to another embodiment of the present invention. The optical semiconductor package 200 is similar to the optical semiconductor package 100, and the identical elements are designated with the similar reference numerals. The optical semiconductor package 200 further comprises two paired snapping elements including a groove 244 and a protrusion 248 which are disposed on the supporter 240 and the window 242, respectively. The protrusion 248 of the window 242 is snapped with or held in the groove 244 of the supporter 240 so as to securely fix the window 242 on the supporter 240 and keep the window 242 in place during the overmolding process. Further, the paired snapping elements, i.e. the groove 244 and the protrusion 248, are cooperated with each other to seal the junction of the supporter 240 and the window 242 and further prevent the encapsulant 230 from flushing over the window 242 during the overmolding process. Besides, since the window 242 and the supporter 240 are joined together, the window 242 and the supporter 240 can be handled more easily.

Figure 4:
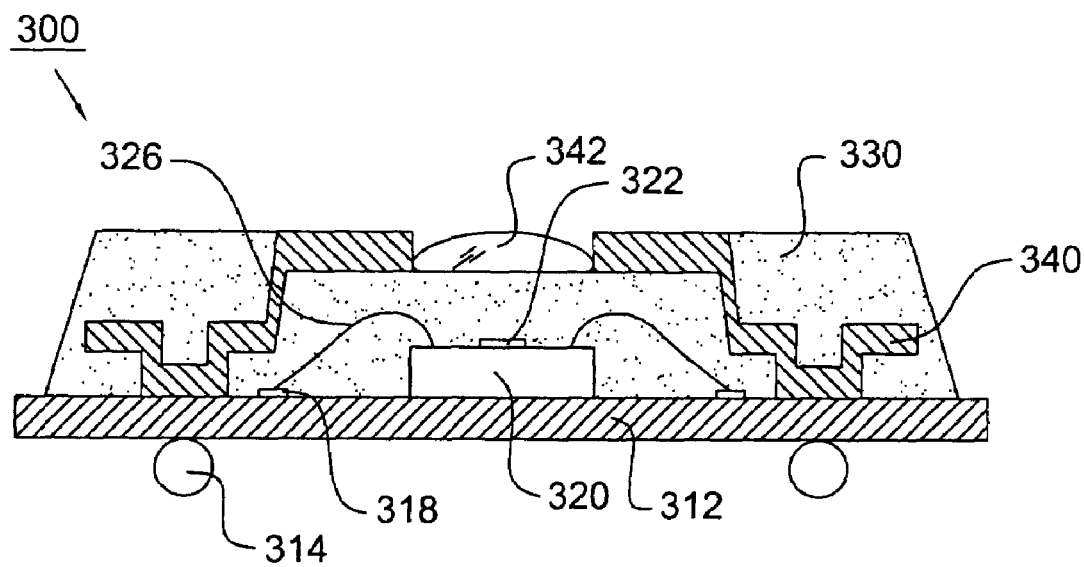
FIG. 4 is a schematic cross-sectional view of an optical package according to a further embodiment of the present invention.

Now referring to FIG. 4, it depicts an optical semiconductor package 300 according to further another embodiment of the present invention. The optical semiconductor package 300 is similar to the optical semiconductor package 100, and the identical elements are designated with the similar reference numerals. The optical semiconductor package 300 further comprises a lens 342 in place of the window 142 of the optical semiconductor package 100. The lens 342 is used for focusing the light on to the optical elements 322 of the chip 320 and thus increasing the intensity of the light, thereby increasing the sensitivity of the optical semiconductor package 300.

Figure 5:
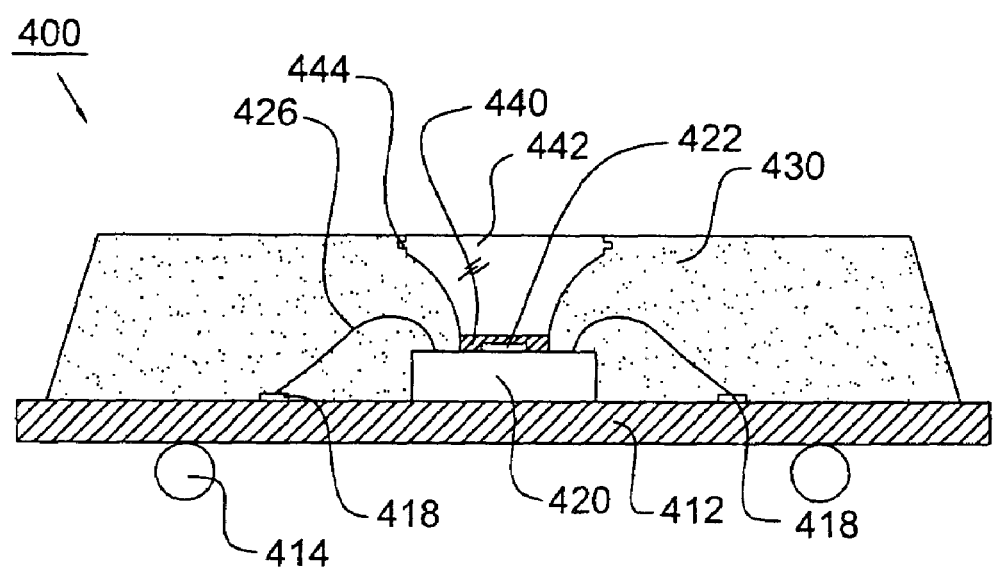
FIG. 5 is a schematic cross-sectional view of an optical package according to a still further embodiment of the present invention.

Now referring to FIG. 5, it depicts an optical semiconductor package 400 according to still another embodiment of the present invention. The optical semiconductor package 400 is similar to the optical semiconductor package 100, and the identical elements are designated with the similar reference numerals. The optical semiconductor package 400 further comprises a window 442 directly disposed or mounted on the optical element 422 of the chip 420 by an adhesive 440.

The adhesive 440 is a thin layer for retaining the high optical transmission to the chip, and can be made of a material which is of high optical transmission, such as acrylate. It will be apparent to those skilled in the art that the encapsulant 430 of the optical semiconductor package 400 can be made of an opaque material because the encapsulant 430 does not cover the optical elements 422 of the chip 420. The window 442 is further provided with a plurality of mold locks or ledges 444 for securing the window 442 in the encapsulant 430.

Figure 6:
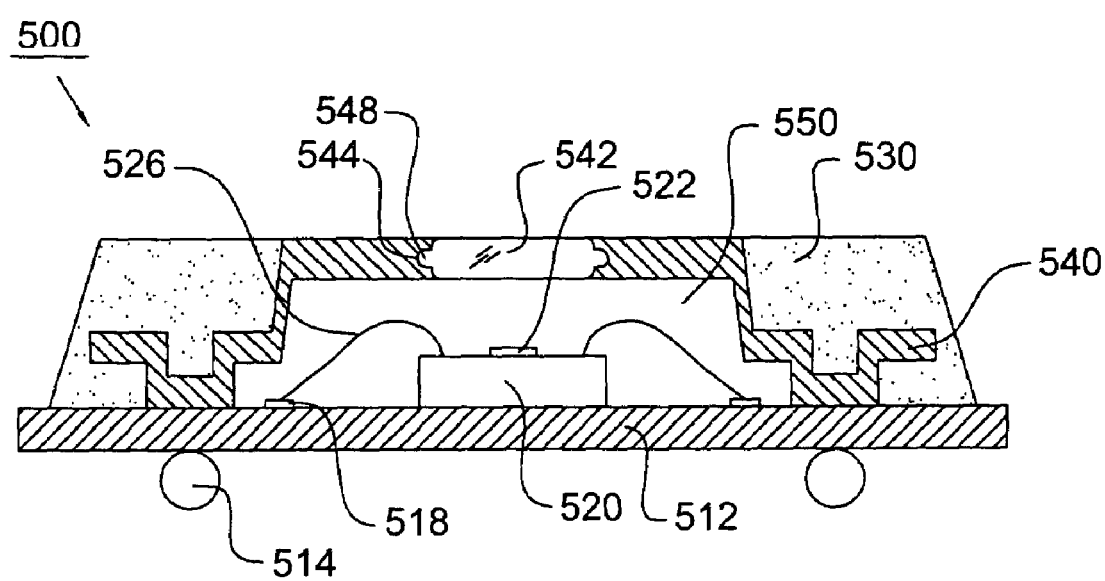
FIG. 6 is a schematic cross-sectional view of an optical package according to yet another embodiment of the present invention.

Now referring to FIG. 6, it depicts an optical semiconductor package 500 according to still another embodiment of the present invention. The optical semiconductor package 500 is similar to the optical semiconductor package 200, and the identical elements are designated with the similar reference numerals. The optical semiconductor package 500 is provided with a supporter 540 which is hermetically disposed on the substrate 512 to form a cavity 550. The encapsulant 530 encapsulates the supporter 540 so as to fix the supporter 540 on the substrate 512. The chip 520 and the bonding wires 526 are positioned in the cavity 550. The window 542 is hermetically disposed on the supporter 540 for transmitting light into and out of the cavity 550. As indicated in the foregoing description, the substrate of the optical semiconductor package according to the present invention is not required to have a cavity for receiving the chip, so the substrate can be substantially planar and be an organic laminate or ceramic substrate such that the cost of the substrate is substantially reduced. Furthermore, according to the manufacturing processes of the present invention, the substrate in matrix array can be utilized for mass production and the cost of the optical semiconductor package can be further reduced.

While the foregoing description and drawings represent the preferred embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. An optical semiconductor package, comprising:
   a substrate having opposite upper and lower surfaces;
   a chip disposed on the upper surface of said substrate and having an optical element on an upper surface of said chip;
   a plurality of bonding pads disposed on the upper surface of said substrate;
   a plurality of bonding wires electrically connecting the chip to the bonding pads;
   a transparent adhesive layer;
   a window made of a transparent material mounted on the optical sensor of the chip by said transparent adhesive layer which is disposed between said window and said optical sensor for allowing light to transmit through the window and interact with the optical sensor; and
   an encapsulant formed on the substrate for fixing the window and encapsulating the chip and the bonding wires;
   wherein
   said window has opposite upper and lower surfaces and a side surface connecting the upper and lower surfaces of said window;
   said transparent adhesive layer directly, physically contacts both the lower surface of said window and an upper surface of said optical sensor of said chip and attaches the lower surface of said window and the upper surface of said optical sensor together; and
   said encapsulant surrounds said window and directly, physically contacts the side surface of said window, while leaving the upper surface of said window exposed from an upper surface of said encapsulant wherein said encapsulant and said adhesive layer are made of different materials.

2. An optical semiconductor package, comprising:

a substrate having opposite upper and lower surfaces;

a chip disposed on the upper surface of said substrate and having an optical sensor;

a plurality of bonding wires electrically connecting the chip to the substrate;

a supporting wall extending upwardly from the upper surface of said substrate;

a window made of a transparent material and supported by said supporting wall at a location above said optical sensor for allowing light to transmit through the window and interact with the optical sensor; and an encapsulant formed on the upper surface of said substrate to surround said supporting wall;

wherein said supporting wall comprises:

a first section extending upwardly from the upper surface of said substrate and inwardly toward the window, said first section having opposite upper and lower ends, the lower end being on the upper surface of said substrate;

a second section extending inwardly from the upper end of the first section, said second section supporting thereon said window; and a third section extending upwardly from the lower end of said first section and outwardly away from the window, said third section being embedded in said encapsulant;

wherein said first and third sections define together a cavity located between two upper surfaces of the first section and the third section which surfaces are parallel to the substrate, said cavity receiving therein a portion of said encapsulant.

3. The optical semiconductor package as claimed in claim 2, wherein said encapsulant includes an outer portion covering an outer side surface of said supporting wall; and an inner portion encapsulating said chip and said wires and covering an inner side surface of said supporting wall, wherein said inner portion of said eneapsulant is transparent.

4. The optical semiconductor package as claimed in claim 2, wherein said encapsulant, said supporting wall, said window and said substrate together define a hermetically sealed cavity in which said chip, said optical sensor and said wires are disposed.

5. The optical semiconductor package as claimed in claim 1, wherein the encapsulant is made of an opaque material.

6. The optical semiconductor package as claimed in claim 5, wherein the window is a lens.

7. The optical semiconductor package as claimed in claim 1, comprising a straight light path that extends from the upper surface of said window to the upper surface of said optical sensor and through said window and said adhesive layer only, wherein said light path does not extend through said encapsulant.

* * * * *